United States Patent
Segawa et al.

(10) Patent No.: US 7,940,064 B2
(45) Date of Patent: May 10, 2011

(54) METHOD AND APPARATUS FOR WAFER LEVEL BURN-IN

(75) Inventors: Terutsugu Segawa, Osaka (JP); Minoru Sanada, Osaka (JP)

(73) Assignee: Panasonic Corporation, Osaka (JP)

( * ) Notice: Subject to any disclaimer, the term of this patent is extended or adjusted under 35 U.S.C. 154(b) by 257 days.

(21) Appl. No.: 12/063,276

(22) PCT Filed: May 29, 2006

(86) PCT No.: PCT/JP2006/310686
§ 371 (c)(1),
(2), (4) Date: Feb. 8, 2008

(87) PCT Pub. No.: WO2007/017981
PCT Pub. Date: Feb. 15, 2007

(65) Prior Publication Data
US 2009/0102499 A1 Apr. 23, 2009

(30) Foreign Application Priority Data
Aug. 9, 2005 (JP) .................. 2005-230194

(51) Int. Cl.
*G01R 31/00* (2006.01)
(52) U.S. Cl. ......... 324/750.03; 324/750.05; 324/750.06; 324/750.28
(58) Field of Classification Search .......... 324/754–765, 324/158.1, 750.06, 750.28
See application file for complete search history.

(56) References Cited

U.S. PATENT DOCUMENTS

| | | | | |
|---|---|---|---|---|
| 4,787,752 A * | 11/1988 | Fraser et al. | ..................... | 374/45 |
| 5,001,423 A * | 3/1991 | Abrami et al. | ................. | 324/760 |
| 5,260,668 A * | 11/1993 | Mallory et al. | ................ | 324/719 |
| 5,325,052 A * | 6/1994 | Yamashita | ..................... | 324/754 |
| 5,359,285 A * | 10/1994 | Hashinaga et al. | ...... | 324/750.07 |
| 6,111,421 A * | 8/2000 | Takahashi et al. | ............ | 324/758 |
| 6,518,782 B1 * | 2/2003 | Turner | ..................... | 324/750.03 |
| 6,972,581 B2 * | 12/2005 | Yamashita et al. | ............ | 324/760 |
| 7,355,428 B2 * | 4/2008 | Kabbani et al. | ................ | 324/760 |
| 2002/0014894 A1 * | 2/2002 | Yonezawa et al. | ............ | 324/760 |
| 2002/0186031 A1 * | 12/2002 | Pelissier | ........................ | 324/760 |
| 2003/0155939 A1 * | 8/2003 | Lutz et al. | ..................... | 324/760 |
| 2003/0201068 A1 * | 10/2003 | Mercaldi et al. | .......... | 156/345.27 |
| 2004/0227536 A1 * | 11/2004 | Sugiyama et al. | ............ | 324/760 |
| 2009/0160472 A1 * | 6/2009 | Segawa et al. | ................ | 324/760 |

FOREIGN PATENT DOCUMENTS

| | | |
|---|---|---|
| EP | 0 915 499 A2 | 5/1999 |
| EP | 1 174 723 A1 | 1/2002 |
| JP | 10-256325 | 9/1998 |

* cited by examiner

*Primary Examiner* — Ha Tran T Nguyen
*Assistant Examiner* — Richard Isla Rodas
(74) *Attorney, Agent, or Firm* — Steptoe & Johnson LLP

(57) ABSTRACT

A temperature regulation plate 106 is divided into at least two areas, a heater 408 for applying a temperature load in correspondence with such areas and its control system are divided and controlled independently to set temperatures, and a cooling source is controlled by comparing the measurements from temperature sensors 409 arranged in respective areas for controlling the heater 408 and switching the measurement for calculating the control output sequentially thus reducing variation in in-plane temperature of a wafer due to heating when an electric load is applied. Since consumption and burning of a probe are prevented, highly reliable wafer level burn-in method and apparatus can be provided.

18 Claims, 10 Drawing Sheets

METHOD AND APPARATUS FOR WAFER LEVEL BURN-IN

TECHNICAL FIELD

The present invention relates to a wafer level burn-in method and a wafer level burn-in apparatus to perform screening by applying an electric load and a temperature load to a semiconductor wafer.

BACKGROUND ART

Conventionally, a screening test device generally called as a burn-in apparatus performs screening of defective products in such a manner that, after packaging IC chips obtained by dividing a semiconductor wafer, a current applying test of the packaged IC chips is performed in a thermal atmosphere at a predetermined temperature (e.g., 125° C.), and thus latent defects are exposed.

Since such a conventional device needs a large constant-temperature device and has a large calorific value, the device needs to operate in a room separated from other production lines. Accordingly, it is desired to perform a burn-in test in a wafer level before becoming a chip because of: troubles such as transport of a wafer, attachment to and detachment from a device; wasteful packaging costs incurred by the detection of defective products after packaging; and a demand for a so-called bear chip quality-assured to mount the chip as it is without packaging the chip.

A burn-in apparatus for meeting these demands needs to keep a wafer at a uniform temperature, when a thermal load is applied to a semiconductor wafer. There has been proposed a wafer level burn-in apparatus having a temperature control function to keep a semiconductor wafer at a predetermined target temperature by providing heaters on both front and back sides of the wafer.

However, in the temperature control of the conventional method, a wafer surface is subjected to heating and cooling collectively. Accordingly, when an electric load is applied to the wafer, the electric load is not applied to any defective one of devices formed on the wafer. Therefore, variation in heat generation occurs due to the application of the electric load to the wafer and thus the temperature of the wafer is not uniform on the surface of the wafer. However, nothing has been done about it.

The conventional wafer level burn-in will be described in detail with reference to FIGS. 9, 10, and 11.

FIG. 9 is a schematic diagram illustrating a conventional wafer level burn-in apparatus. FIG. 10 is a diagram illustrating the distribution of conforming devices in wafer level burn-in. FIG. 11 is a diagram illustrating temperature variation of devices in conventional wafer level burn-in.

In FIG. 9, a wafer 101 is supported in a wafer support tray 102, the wafer 101 is connected to a substrate 104 applying an electric load through a probe 103 capable of collectively contacting the wafer 101, and an electric load is applied to the wafer 101 by a tester 105 having functions of applying electric loads, generating electric signals and comparing signals. A temperature load is applied by controlling the temperature of a temperature regulation plate 106 to 125° C. using a heater 108 and refrigerant such as water and alcohol flowing through a refrigerant flowing passage 107, which are disposed in the temperature regulation plate 106. A temperature regulator 110 controls the temperature of the temperature regulation plate 106 by controlling a calorific value of the heater 108 and controlling a temperature and a flow rate of the refrigerant flowing through the refrigerant flowing passage 107, on the basis of the temperature measured by a temperature sensor 109. In actual wafer level burn-in, devices are heated from a room temperature to 125° C. by the heater 108, an electric load is then applied to the devices on a wafer by the tester 105, and the tester 105 confirms whether the devices formed on the wafer break down or not at predetermined time intervals. In the course of the operation confirmation, the electric load of the tester 105 is cut off and the devices are operated by applying an electrical signal for the operation confirmation to the devices. Outputs from the devices are monitored by the tester 105 to confirm whether or not the devices break down due to the electric load and the temperature load.

FIG. 10 is a diagram illustrating the distribution of conforming products of the devices formed on the wafer. Hatched parts denote conforming devices and non-hatched parts denote defective devices. When an electric load is applied to the conforming products, the conforming products generate heat. However, since an electric load cannot be applied to the defective devices, the defective products do not generate heat. FIG. 11 is a graph illustrating temperature variation in wafer level burn-in between a conforming device 201 located in the vicinity of a part where conforming products are collected on the wafer in FIG. 10 and a conforming device 202 located in the vicinity of a part where defective products are collected. After the devices are heated to 125° C., an electric load is applied at a time T. Since the conforming device 201 located in the vicinity of the part where the conforming products are collected is at a high temperature, consumption of probe is accelerated. Since the conforming device 202 located in the vicinity of the part where the defective products are collected is at a low temperature, a temperature load set for the adjacent conforming devices cannot be applied.

An increase in diameter of wafer from 200 mm to 300 mm as well as an increase in calorific value at the time of applying the electric load on the wafer in conjunction with a decrease in size of IC chips or an increase in applied current result in decreasing in-plane uniformity of a wafer temperature. In the conventional wafer of 200 mm, a calorific value at the time of applying an electric load is about 400 W and a heat density is 12.74 kW/m². However, in a wafer of 300 mm, it is considered that a calorific value is more than 3 kW, and in this case a heat density is 42.46 kW/m². Simply assuming that the wafer support tray 102 in FIG. 9 is an aluminum plate with a thickness of 10 mm and with a thermal conductivity of 200 W/m·K, temperature difference caused by thermal conduction between two aluminum plates with a diameter of 200 mm and 300 mm is obtained. A portion with a center diameter of 20 mm in the aluminum plate with a diameter of 200 mm is controlled constantly to 125° C. When the generation of heat with a heat density of 12.74 kW/m² occurs at the portion with the center diameter of 20 mm, a calorific value is 4.0 W. When all the heat is thermally conducted in a radius direction of the aluminum plate, the temperature of the aluminum plate on the circumference is 124.3° C. after stabilization. Similarly, when the generation of heat with a heat density of 42.46 kW/m² occurs at a portion with a diameter of 20 mm in the aluminum plate with a diameter of 300 mm, a calorific value is 13.3 W and a temperature of the aluminum plate on the circumference is 122.1° C. Accordingly, it can be seen that the temperature difference increases more than the case of the aluminum plate with a diameter of 200 mm. In the actual wafer level burn-in, since the distribution of heat generation is different for each wafer according to the distribution of conforming devices formed on the wafer, it is difficult to control the temperature of the wafer to about 125° C. with the configuration of FIG. 9.

DISCLOSURE OF THE INVENTION

In the conventional wafer level burn-in, the conforming device 201 located in the vicinity of the part where the conforming products are collected is at high temperature. Accordingly, consumption of a probe may be accelerated. The conforming device 202 located in the vicinity of the part where the defective products are collected is at low temperature. Accordingly, the temperature load set for the adjacent conforming devices cannot be applied thereto.

In addition, the temperature difference between the center portion and the peripheral portion of the wafer due to the heat density becomes conspicuous with an increase in diameter of wafer.

When the temperature of a part of the wafer increases due to a decrease in in-plane uniformity, the probe for applying an electric load to the water may be extremely consumed or burnt out to result in serious damage. When the temperature of a part of the wafer decreases, it is insufficient to perform screening by the temperature load. Accordingly, defective products may flow into the market.

The invention is made to solve the aforementioned problems, and an object of the invention is to provide a wafer level burn-in method and a wafer level burn-in apparatus with high reliability, which do not depend on the distribution of conforming products of devices formed on a wafer and the power consumption of the devices, and in which variation in in-plane temperature of the wafer due to the generation of heat at the time of applying an electric load is reduced to prevent probes from being consumed and burnt.

In order to achieve the above object, according to the present invention, a wafer level burn-in apparatus for performing screening of defective products by collectively applying an electric load and a temperature load to all devices formed on a semiconductor wafer divided into a plurality of areas includes: a plurality of temperature sensors that measure temperatures of the areas, respectively; a plurality of heaters that heat the areas, respectively; a plurality of temperature regulators that control the heaters in response to the temperatures measured by the temperature sensors so that the temperature of each area becomes a predetermined temperature; a cooling source that cools the whole semiconductor wafer; a switching controller that selects the temperatures measured by the temperature sensors to control the cooling source; a cooling temperature regulator that controls the cooling source in response to the temperature selected by the switching controller; and a tester that inspects the devices, wherein the whole semiconductor wafer is cooled by selecting one temperature to be used for cooling control among the temperatures measured by the plurality of temperature sensors and heating control is performed for each area, thereby controlling the temperature of the semiconductor wafer to the predetermined temperature to perform wafer burn-in.

The cooing source may be a refrigerant flowing passage for flowing refrigerant therethrough and the cooling temperature regulator may be a temperature regulator for controlling a refrigerant flow rate.

The cooling source may be an air blower and the cooling temperature regulator may be a temperature regulator for controlling an air blow rate.

The switching controller may continuously select the temperature to be used for the cooling control.

The switching controller may select the temperature to be used for the cooling control at predetermined time intervals.

The switching controller may select the temperature used for the cooling control when the intensity of the electric load is switched.

The predetermined temperature may be set for each area.

Furthermore, according to the present invention, a wafer level burn-in method of performing screening of defective products by collectively applying an electric load and a temperature load to all devices formed on a semiconductor wafer divided into a plurality of areas to control a temperature of the semiconductor wafer to a predetermined temperature, comprises the steps of: applying the electric load and the temperature load; measuring the temperature of each area; cooling the whole semiconductor wafer by performing cooling control of a cooling source using one temperature selected from the temperatures measured by a plurality of temperature sensors; and heating the respective areas by performing heating control of the respective areas in response to the temperatures measured for the respective areas.

The cooling source may be a refrigerant flowing passage for flowing refrigerant therethrough and the whole semiconductor wafer may be cooled by controlling a refrigerant flow rate.

The cooling source may be an air blower and the whole semiconductor wafer may be cooled by controlling an air blow rate.

The selected temperature to be used for the cooling control may be the highest temperature of the measured temperatures of the areas.

The selected temperature to be used for the cooling control may be selected in such a manner that when there is one median value among the measured temperatures of the areas, the temperature of the median value is selected; and when there are two median values, the higher temperature among the two temperatures of the median values is selected.

The selected temperature to be used for the cooling control may be a value closest to an average value of the measured temperatures of the areas.

The selected temperature to be used for the cooling control may be the largest value of temperature deviations obtained by subtracting the measured temperatures from the predetermined temperatures of the areas and an output of the cooling source may be controlled so that the value of the temperature deviation becomes 0 or near 0.

The predetermined temperatures may be set respectively for the areas.

The temperature to be used for the cooling control may be continuously selected.

The temperature to be used for the cooling control may be selected at predetermined time intervals.

The temperature to be used for the cooling control may be selected when the intensity of the electric load is switched.

The cooling source may be continuously controlled.

The cooling source may be controlled at predetermined time intervals.

BRIEF DESCRIPTION OF THE DRAWINGS

FIG. 10 is a diagram illustrating the distribution of conforming products of devices in wafer level burn-in.

FIG. 11 is a diagram illustrating temperature variation in conventional wafer level burn-in.

BEST MODE FOR CARRYING OUT THE INVENTION

Figure 1:
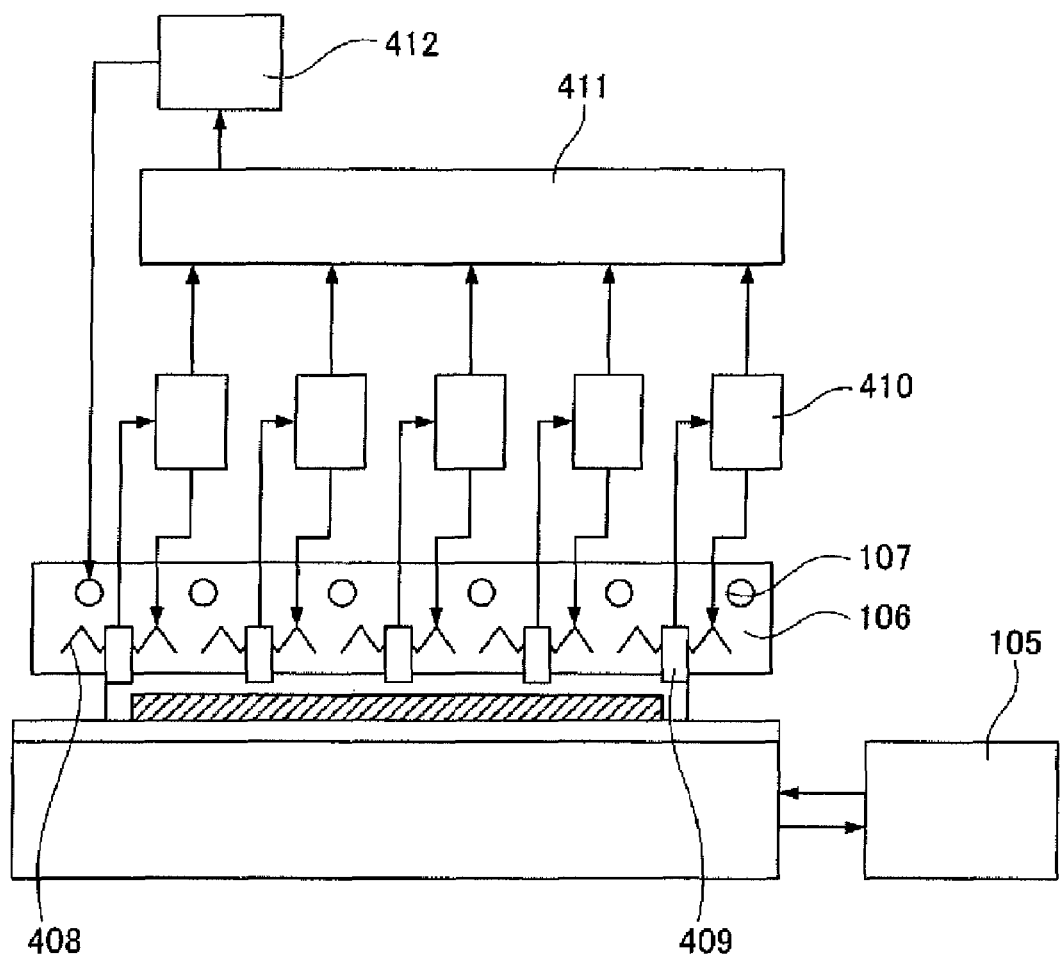
FIG. 1 is a schematic diagram illustrating a wafer level burn-in apparatus according to Embodiment 1 of the invention.

There are provided a wafer level burn-in method and a wafer level burn-in apparatus according to the present invention that includes, to control a semiconductor wafer to a predetermined temperature, heaters that heat a plurality of areas into which the semiconductor wafer has been divided, respectively, temperature sensors that measure temperatures, and temperature regulators that control the heaters so that the wafer becomes at the predetermined temperature. The wafer level burn-in apparatus further includes a cooling source such as a refrigerant flowing passage that cools the whole semiconductor wafer, a switching controller that selects the measured temperature to be used for cooling control among the temperatures measured by the temperature sensors under a predetermined condition, and a cooling temperature regulator that controls the cooling source in response to the selected measured temperature. With such a configuration, when the temperature of any one area is higher than the predetermined temperature, one temperature is selected from the temperatures of the areas, under the predetermined condition and the cooling control can be performed in response to the selected temperature. Alternatively, when the temperatures of the areas are lower than the predetermined temperature, the heating control can be performed in response to the temperature measured for each area. As described above, since the temperature control is performed for each area, it is possible to reduce variation in in-plane temperature of the wafer caused by heat generated at the time of applying an electric load, without depending on the distribution of conforming products of devices formed on the wafer or power consumption of the devices. Consequently, consumption and burning of probes are prevented and thus it is possible to provide a highly reliable wafer level burn-in apparatus and wafer level burn-in method.

In this case, the predetermined temperatures of the temperature regulators may be all the same or may be individually set for each area. When the set temperatures are separately set, the cooling temperature regulator controls the cooling source with respect to the largest value among the temperature deviations from the measured temperatures so that the temperatures of the divided areas can be controlled to the predetermined temperature.

As the measured temperature to be used for the cooling control, the measured temperature constantly satisfying the condition may be continuously selected in the course of applying a temperature load. Further, the measured temperature may be selected at predetermined time intervals to use the selected measured temperature during a predetermined time period. The measured temperature may be selected every time the intensity of the electric load is switched in line with the time of applying the electric load.

As for the timing of the cooling control, the cooling control may be continuously performed which constantly corresponds to the selected measured temperature. Also, the cooling control may be performed at predetermined time intervals in response to the measured temperature selected at that time.

The method to select the cooling temperature and the timing to perform the cooling control may be selected according to heat generation of the semiconductor wafer or the configuration of the wafer level burn-in apparatus. For example, when a prompt response to change in temperature is necessary, the selection and the control may be performed in a continuous manner. When a response of the cooling source to the output of the cooling temperature regulator is delayed or an oversensitive response of the cooling source is avoided, the selection and the control may be performed at predetermined time intervals.

Hereinafter, embodiments of the invention will be described in detail with reference to the drawings.

Embodiment 1

A wafer level burn-in apparatus and a wafer level burn-in method according to Embodiment 1 will be described with reference to FIGS. 1, 2, 3, and 4.

Figure 2:
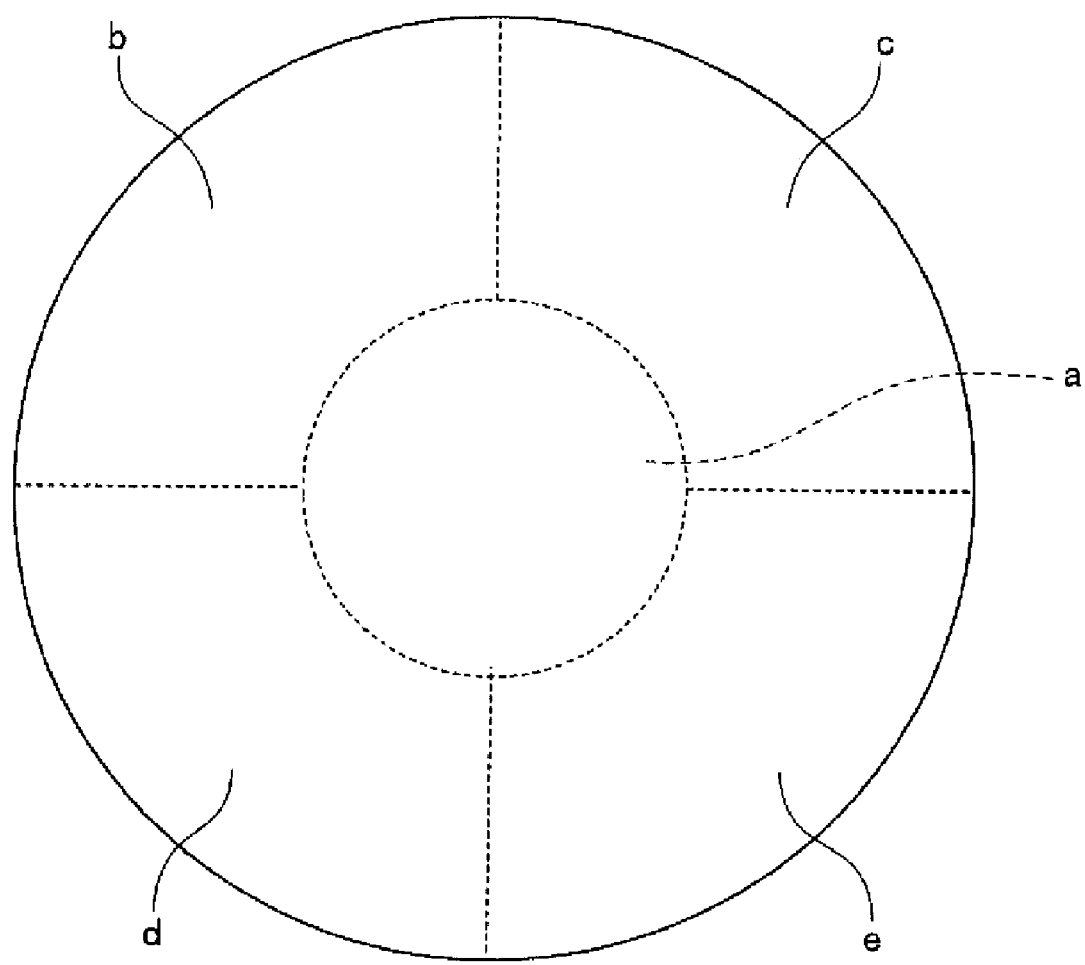
FIG. 2 is a schematic diagram illustrating area division of a temperature regulation plate according to Embodiment 1 of the invention.
Figure 3:
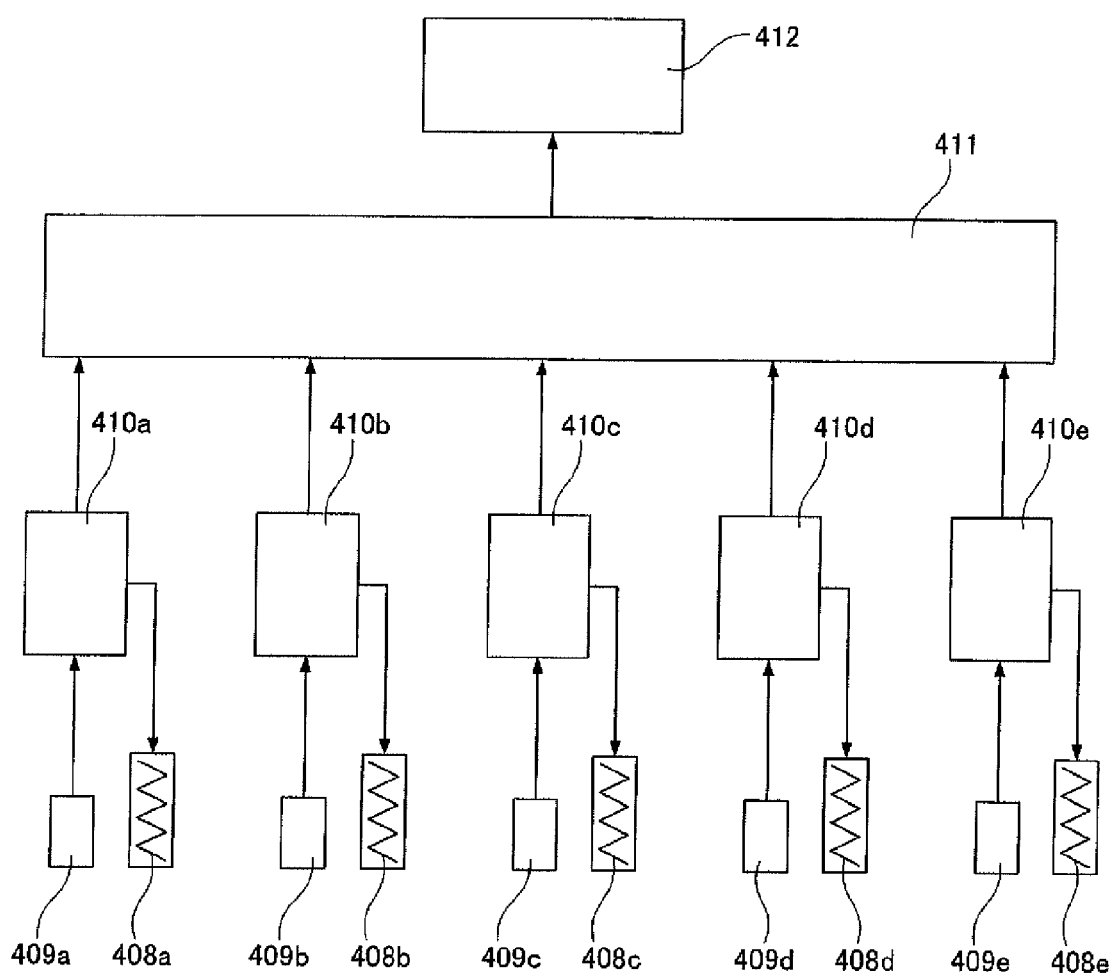
FIG. 3 is a schematic diagram illustrating a temperature control system for the temperature regulation plate according to Embodiment 1 of the invention.
Figure 4:
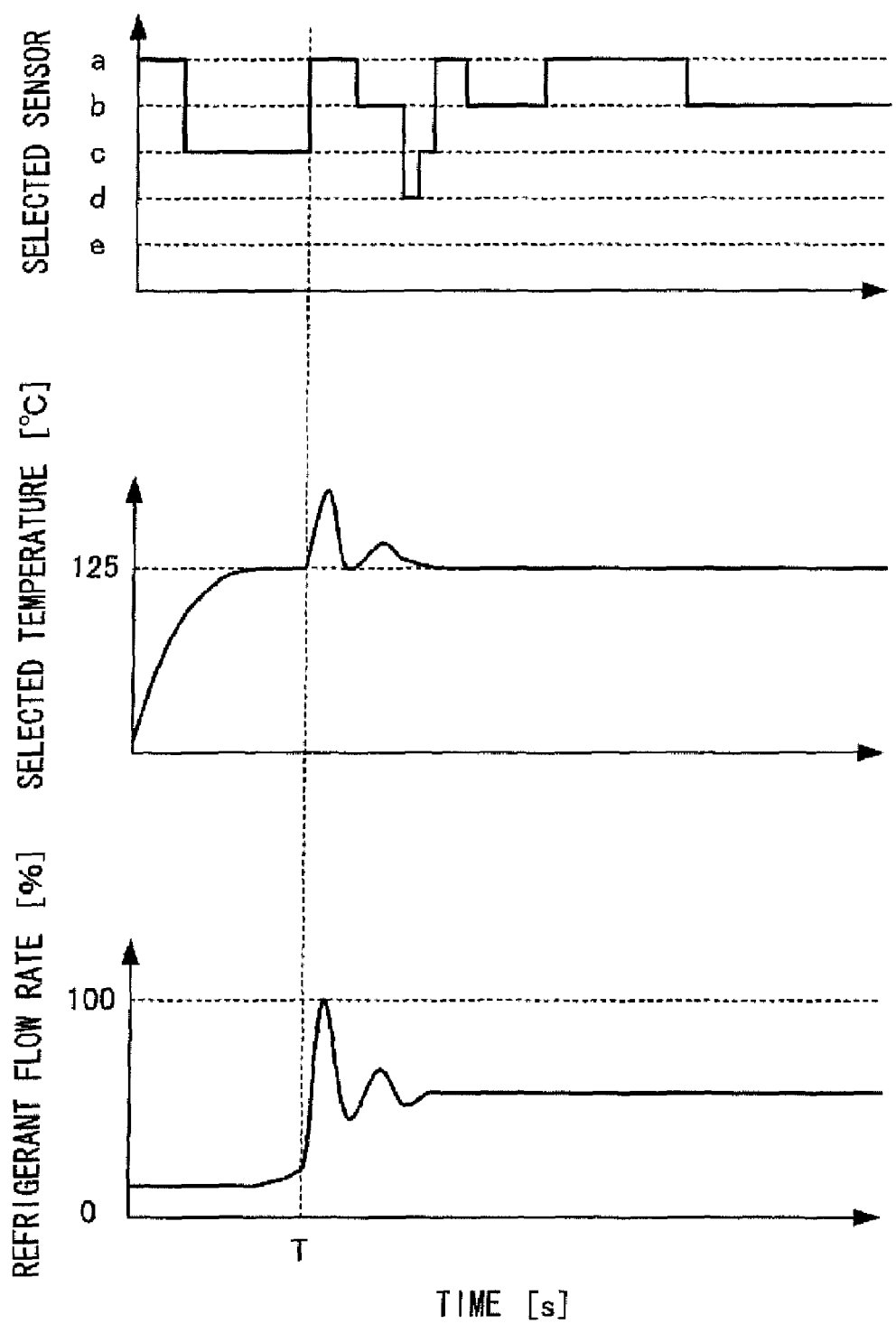
FIG. 4 is a diagram illustrating temperature control at the time of wafer level burn-in according to Embodiment 1 of the invention.

FIG. 1 is a schematic diagram illustrating the wafer level burn-in apparatus according to Embodiment 1. FIG. 2 is a diagram illustrating area division of a temperature regulation plate according to Embodiment 1 of the invention. FIG. 3 is a schematic diagram illustrating a temperature control system for the temperature regulation plate according to Embodiment 1 of the invention. FIG. 4 is a diagram illustrating temperature control at the time of wafer level burn-in according to Embodiment 1 of the invention.

Figure 9:
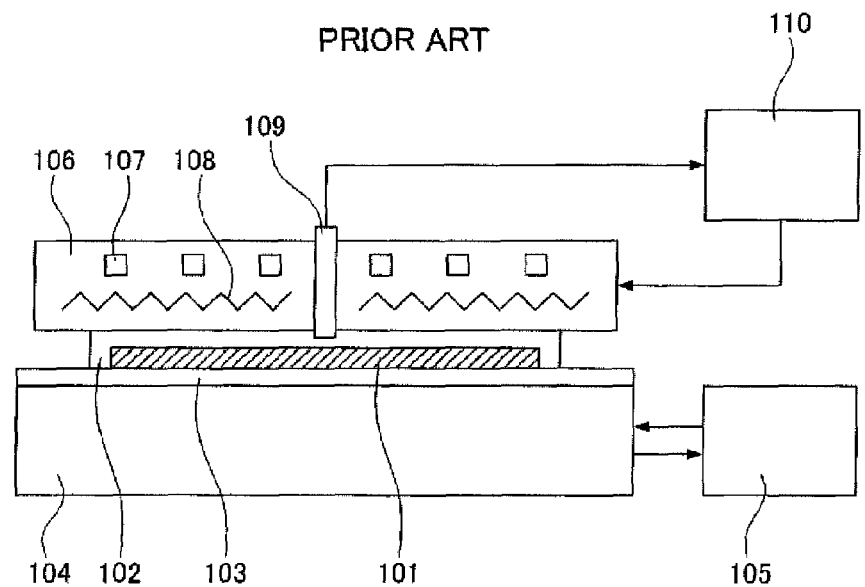
FIG. 9 is a schematic diagram illustrating a conventional wafer level burn-in apparatus.
Figure 10:
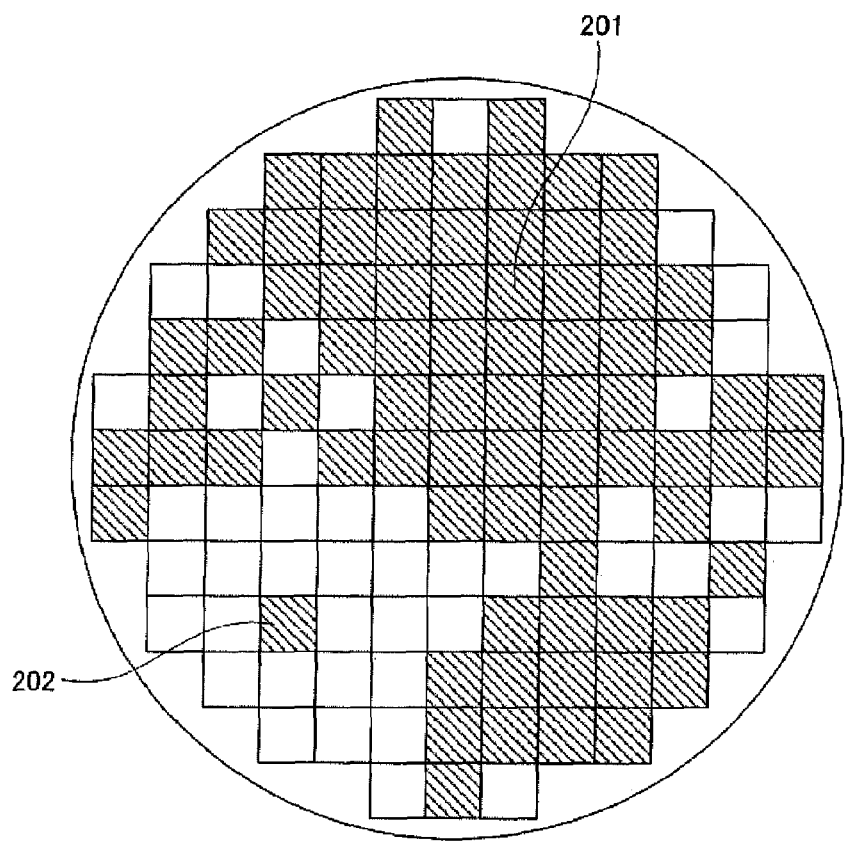
Figure 11:
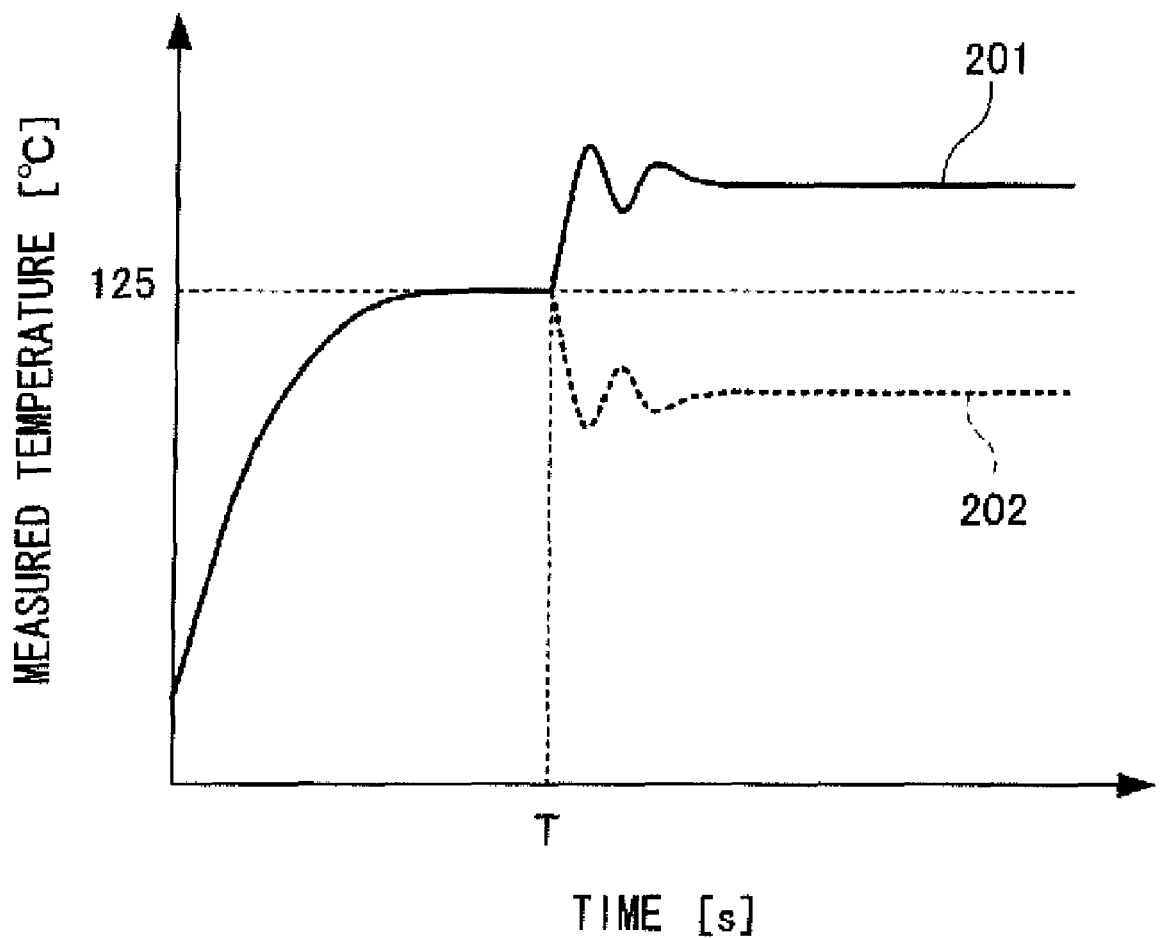

In Embodiment 1 shown in FIG. 1, as compared with the configuration of a device shown in FIG. 9, a temperature regulation plate 106 is divided into five areas of a central area a and its peripheral areas b to e as shown in FIG. 2, one heater 108, one temperature sensor 109, and one temperature regulator 110 for each device are modified to be a heater 408, a temperature sensor 409, and a temperature regulator 410 installed for each area, temperatures measured in the five areas are compared with one another, a value is selected which is used to control a flow rate of refrigerant flowing through a refrigerant flowing passage 107 for flowing refrigerant therethrough to cool the whole semiconductor wafer, and a switching controller 411 for switching and a temperature regulator 412 for controlling the flow rate of the refrigerant are add.

In heating of the temperature regulation plate shown in FIG. 3, temperature regulators 410a to 410e control the outputs of the corresponding heaters 408a to 408e so that the temperatures measured by five sensors 409a to 409e become the predetermined temperature. In cooling, the temperatures measured by the temperature sensors 409a to 409e are compared in the switching controller 411, the temperature sensor is selected under a predetermined condition to switch the temperature sensors to be used for cooling control, an output flow rate of the refrigerant flowing through the refrigerant flowing passage 107 is controlled in response thereto by the temperature regulator 412 for controlling the flow rate of the refrigerant. As described above, since the heating temperatures are controlled by measuring the temperatures of the areas of the divided wafer and the cooling temperatures are controlled using the temperatures measured by the temperature sensors selected under the specific condition, it is possible to regulate the whole wafer to the predetermined temperature by uniformly cooling the whole wafer and then heating the areas to the predetermined temperature.

In the wafer level burn-in according to Embodiment 1, the heating control is performed for each area so that all the set values of the temperature sensors 409*a* to 409*e* are 125° C. The flow rate of the refrigerant is controlled by selecting the largest value among the values measured by the temperature sensors 409*a* to 409*e* and performing the cooling operation with respect to the set value of 125° C.

FIG. 4 is a graph illustrating the transition of the areas in which the temperatures selected as a control target of the refrigerant flow rate are measured, a temporal change in the measured temperatures selected as the control target of the refrigerant flow rate, and a temporal change in the flow rate of the refrigerant, in the wafer level burn-in according to Embodiment 1. In the example of FIG. 4, the areas are heated from a room temperature and stabilized to 125° C., and then an electric load is applied from the tester 105 to the devices formed on the wafer at a time T. Since the temperature in the vicinity of the conforming devices increases as the electric load is applied, the refrigerant flow rate increases. As the control target of the refrigerant flow rate, the area with the highest measured temperature is selected at predetermined time intervals from the time of applying the electric load like the areas a, b, d, c, and a. The refrigerant flow rate is continuously changed with respect to the measured temperature of the area. In this case, since the cooling is performed according to the area with the highest temperature, the area with a temperature lower than the control target temperature of the refrigerant flow rate shown in FIG. 4 exists. For this reason, the area with a temperature lower than the predetermined temperature temporarily exists. However, a decrease in temperature is suppressed by heating every area and the highest temperature is stabilized to 125° C. Further, the temperature is being uniform to 125° C. over the whole surface of the wafer.

In Embodiment 1, the refrigerant is used as the cooling source, but a wind generated by an air blower such as a fan may be blown to the temperature regulation plate. In this case, the temperature regulation plate may be provided with a fin to improve a cooling performance. In Embodiment 1, the wafer is divided into the five areas to control the temperatures by way of example, but the wafer may be divided into two or more areas to control the temperatures in the same manner.

As described above, the wafer is divided into the plurality of areas, and the temperature sensor, the heater, and the temperature regulator are provided for each area. The cooling is controlled in response to the highest measured temperature. The heating is controlled for each area. Accordingly, it is possible to reduce variation in in-plane temperature of the wafer caused by the heat generated at the time of applying the electric load, without depending on the distribution of conforming products of the devices formed on the wafer or power consumption of the devices Consequently, consumption and burning of probes are prevented and thus it is possible to provide a highly reliable wafer level burn-in apparatus and wafer level burn-in method.

Embodiment 2

A wafer level burn-in apparatus and a wafer level burn-in method according to Embodiment 2 will be described with reference to FIGS. 1, 2, 3, and 5.

Figure 5:
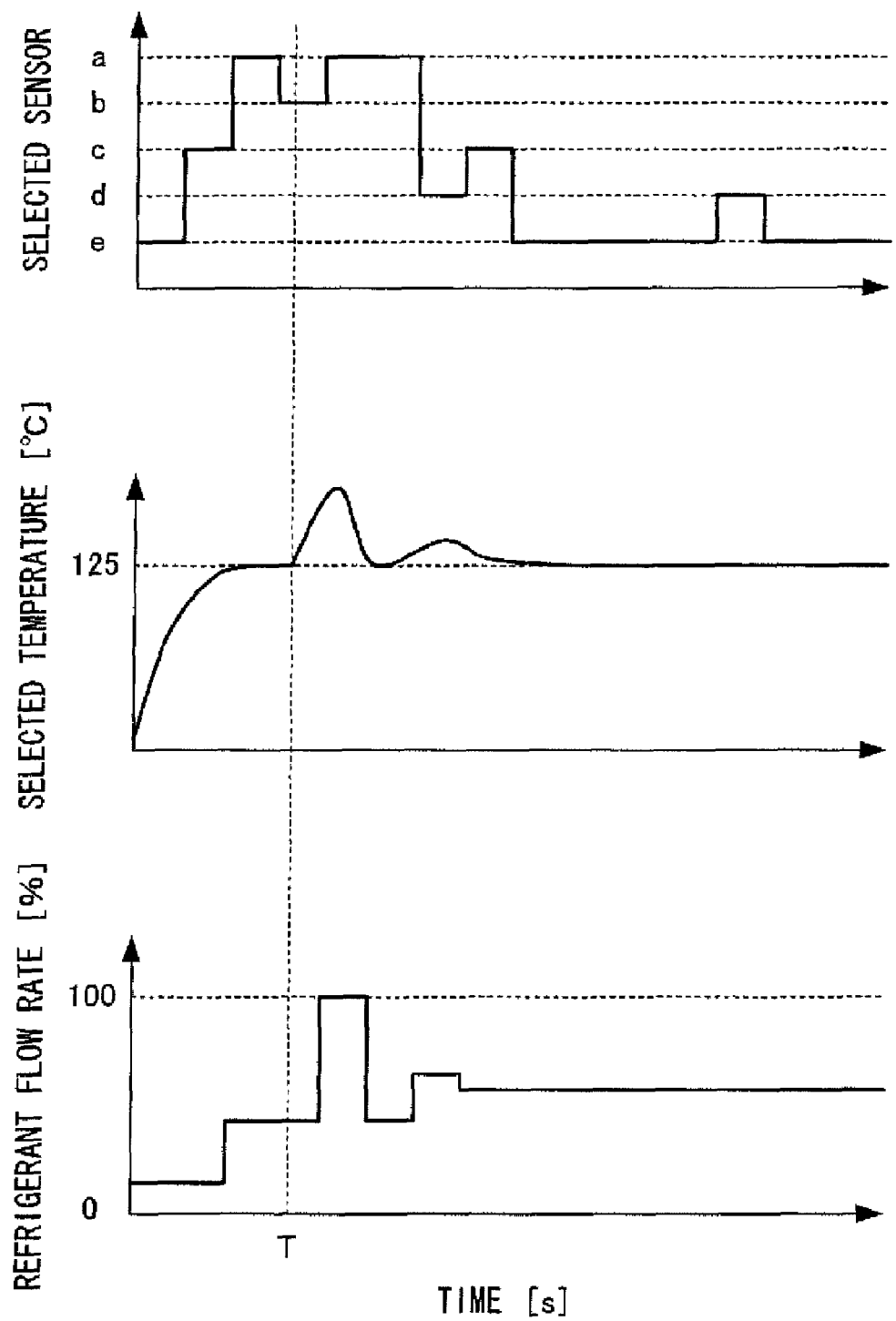
FIG. 5 is a diagram illustrating temperature control at the time of wafer level burn-in according to Embodiment 2 of the invention.

FIG. 5 is a diagram illustrating temperature control at the time of wafer level burn-in according to Embodiment 2 of the invention.

In Embodiment 2 of the invention, the same device configuration as Embodiment 1 shown in FIGS. 1, 2, and 3 is used.

In the wafer level burn-in according to Embodiment 2, heating control is performed for each area so that all the predetermined values of temperature sensors 409*a* to 409*e* are 125° C. The flow rate of refrigerant is controlled by selecting the median value among the values measured by the temperature sensors 409*a* to 409*e* and performing the cooling operation with respect to the predetermined value of 125° C.

FIG. 5 is a graph illustrating the transition of the areas in which the temperatures selected as a control target of the refrigerant flow rate are measured, a temporal change in the measured temperatures selected as the control target of the refrigerant flow rate, and a temporal change in the flow rate of the refrigerant, in the wafer level burn-in according to Embodiment 2. In the example of FIG. 5, the areas are heated from a room temperature and stabilized to 125° C., and then an electric load is applied from a tester 105 to devices formed on a wafer at a time T. Since the temperature in the vicinity of the conforming devices increases as the electric load is applied, the refrigerant flow rate increases. As the control target of the refrigerant, the area with the median value in the temperatures measured by the temperature sensor is selected at predetermined time intervals from the areas like the areas b, a, d, c, and e. The refrigerant flow rate is changed with respect to the measured temperature of the area at predetermined time intervals. In this case, since the cooling is performed according to the area with the median value, the area with a temperature lower than the control target temperature of the refrigerant flow rate shown in FIG. 5 exists. For this reason, the area with a temperature lower than the predetermined temperature temporarily exists. However, a decrease in temperature is suppressed by heating each area. Further, the temperature is being uniform to 125° C. over the whole surface of the wafer.

In Embodiment 2, the refrigerant is used as a cooling source, but a wind generated by an air blower such as a fan may be blown to a temperature regulation plate. In this case, the temperature regulation plate may be provided with a fin to improve a cooling performance. In Embodiment 2, the wafer is divided into the five areas to control the temperatures by way of example, but the wafer may be divided into two or more areas to control the temperatures in the same manner.

As described above, the wafer is divided into the plurality of areas, and the temperature sensor, a heater, and a temperature regulator are provided for each area. The cooling is controlled in response to the measured temperature of the median value among the temperatures measured by the temperature sensors. The heating is controlled for each area. Accordingly, it is possible to reduce variation in in-plane temperature of the wafer caused by the heat generated at the time of applying the electric load, without depending on the distribution of conforming products of the devices formed on the wafer or power consumption of the devices. Consequently, consumption and burning of probes are prevented and thus it is possible to provide a highly reliable wafer level burn-in apparatus and wafer level burn-in method.

Embodiment 3

A wafer level burn-in apparatus and a wafer level burn-in method according to Embodiment 3 will be described with reference to FIGS. 1, 2, 3, and 6.

Figure 6:
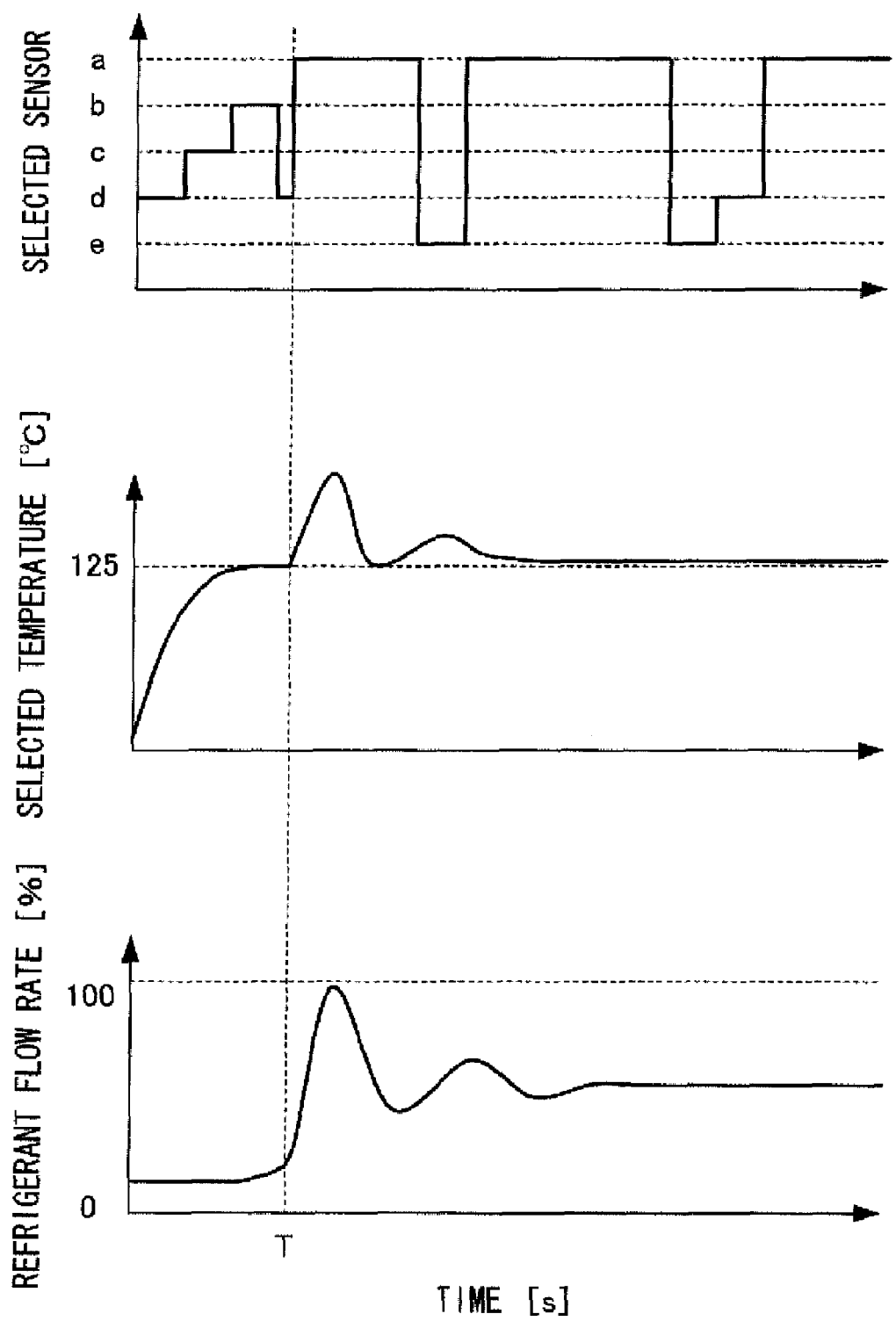
FIG. 6 is a diagram illustrating temperature control at the time of wafer level burn-in according to Embodiment 3 of the invention.

FIG. 6 is a diagram illustrating temperature control at the time of wafer level burn-in according to Embodiment 3 of the invention.

In Embodiment 3 of the invention, the same device configuration as Embodiment 1 shown in FIGS. 1, 2, and 3 is used.

In the wafer level burn-in according to Embodiment 3, the heating control is performed for each area so that all predetermined values of temperature sensors 409a to 409e are 125° C. The flow rate of refrigerant is controlled by selecting the value closest to the average value of values measured by the temperature sensors 409a to 409e among the values or selecting the higher value where there are two candidate values, and performing cooling operation with respect to the predetermined value of 125° C.

FIG. 6 is a graph illustrating the transition of the areas in which the temperatures selected as a control target of the refrigerant flow rate are measured, a temporal change in the measured temperatures selected as the control target of the refrigerant flow rate, and a temporal change in the flow rate of the refrigerant, in the wafer level burn-in according to Embodiment 3. In the example of FIG. 6, the areas are heated from a room temperature and stabilized to 125° C., and then an electric load is applied from a tester 105 to devices formed on a wafer at a time T. Since the temperature in the vicinity of the conforming devices increases as the electric load is applied, the refrigerant flow rate increases. As the control target of the refrigerant, the area with the value closest to the average value of the temperatures measured by the temperature sensors is selected at predetermined time intervals from the time of applying the electric load like the areas a, e, a, e, and d. The refrigerant flow rate is continuously changed with respect to the measured temperature of the area. In this case, since the cooling is performed according to the area with the value closest to the average value, the area with a temperature lower than the control target temperature of the refrigerant flow rate shown in FIG. 6 exists. For this reason, the area with a temperature lower than the predetermined temperature temporarily exists. However, a decrease in temperature is suppressed by heating each area. Further, the temperature is being uniform to 125° C. over the whole surface of the wafer.

In Embodiment 3, the refrigerant is used as a cooling source, but a wind generated by an air blower such as a fan may be blown to the temperature regulation plate. In this case, the temperature regulation plate may be provided with a fin to improve a cooling performance. In Embodiment 3, the water is divided into the five areas to control the temperatures by way of example, but the wafer may be divided into two or more areas to control the temperatures in the same manner.

As described above, the wafer is divided into the plurality of areas, and the temperature sensor, a heater, and a temperature regulator are provided for each area. The cooling is controlled in response to the measured temperature closest to the average value of the temperatures measured by the temperature sensors. The heating is controlled for each area. Accordingly, it is possible to reduce variation in in-plane temperature of the wafer caused by the heat generated at the time of applying the electric load, without depending on the distribution of conforming products of the devices formed on the wafer or power consumption of the devices. Consequently, consumption and burning of probes are prevented and thus it is possible to provide a highly reliable wafer level burn-in apparatus and wafer level burn-in method.

Embodiment 4

A wafer level burn-in apparatus and a wafer level burn-in method according to Embodiment 4 will be described with reference to FIGS. 2, 7, and 8.

Figure 7:
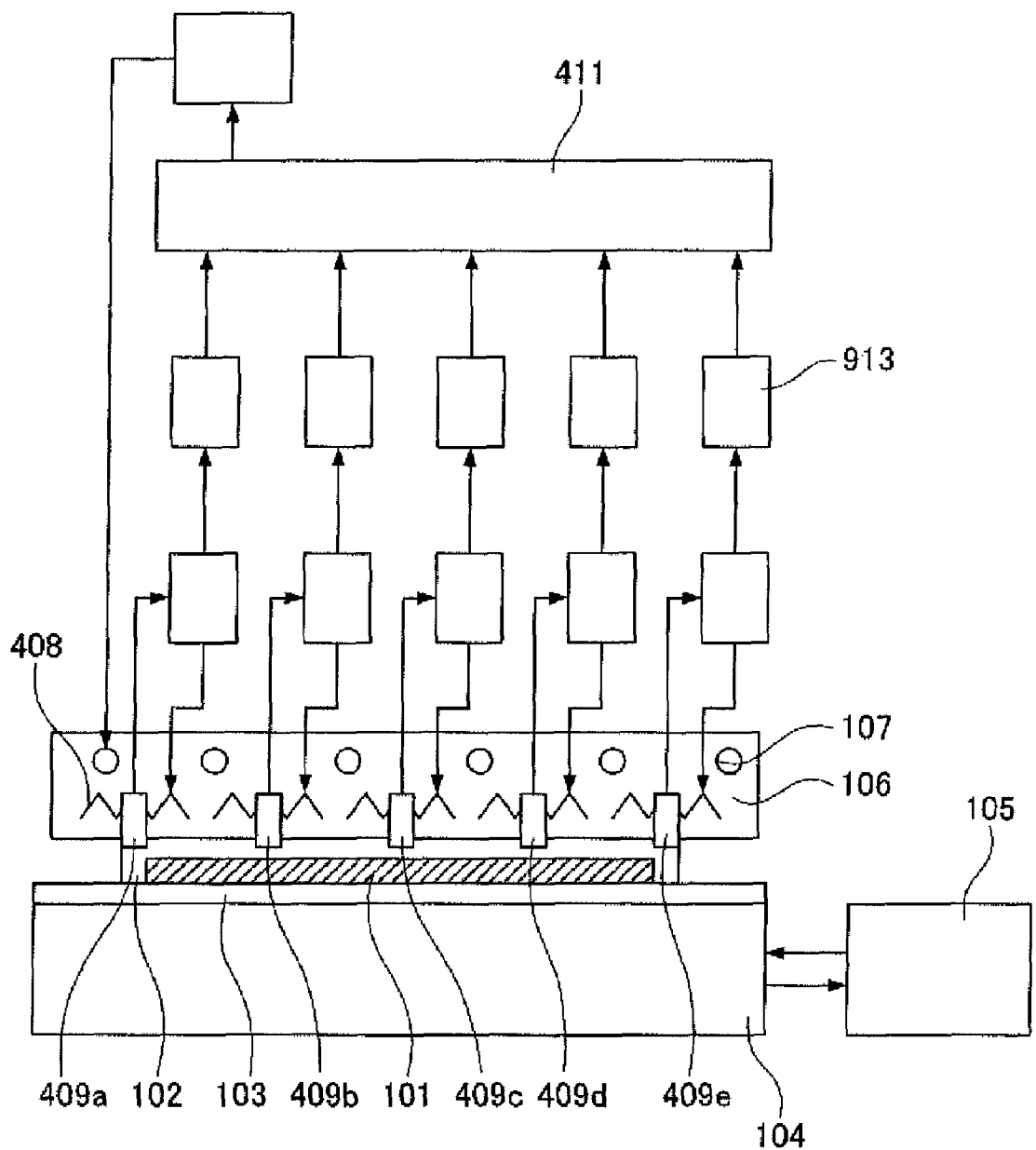
FIG. 7 is a schematic diagram illustrating a wafer level burn-in apparatus according to Embodiment 4 of the invention.

FIG. 7 is a schematic diagram illustrating the wafer level burn-in apparatus according to Embodiment 4 of the invention. A temperature deviation calculating device 913 for calculating the value obtained by subtracting a predetermined temperature value from each temperature measured by each temperature sensor is added to each area in addition to the same device configuration as Embodiment 1 shown in FIGS. 1 and 3. As shown in FIG. 2, a temperature regulation plate 106 is divided into the five areas a to e in the same manner as Embodiment 1. FIG. 8 is a diagram illustrating temperature control at the time of wafer level burn-in according to Embodiment 4 of the invention.

In the wafer level burn-in according to Embodiment 4 as shown in FIG. 7, the heating control is performed for each area so that the predetermined temperature value of the temperature sensor a among the temperature sensors 409a to 409e is 125° C. and the predetermined temperature values of the temperature sensors b to e are 125.5° C. The flow rate of refrigerant is controlled by selecting the largest value among the values obtained by subtracting the predetermined temperature values from the temperatures measured by the temperature sensors 409a to 409e and performing the cooling operation so that the temperature deviation becomes 0° C. In this case, the predetermined temperatures of the sensors b to e are set 0.5° C. higher than the predetermined temperature of the sensor a. The reason for this is that, even when the areas b to e of an outer peripheral portion of the wafer are controlled to 125° C., the temperature of the wafer may be lower than 125° C. due to the heat emitted from an outer peripheral portion of a wafer support tray 102 or the temperature regulation plate 106. In Embodiment 4, the predetermined temperatures of the areas b to e are set 0.5° C. higher than that of the area a, but the predetermined temperatures are not necessarily set higher than that when the heat emitted from the outer peripheral portion is negligibly small. In addition, the predetermined temperatures may be set over 0.5° C. higher than that when the influence of the heat emitted from the outer peripheral portion is large.

Figure 8:
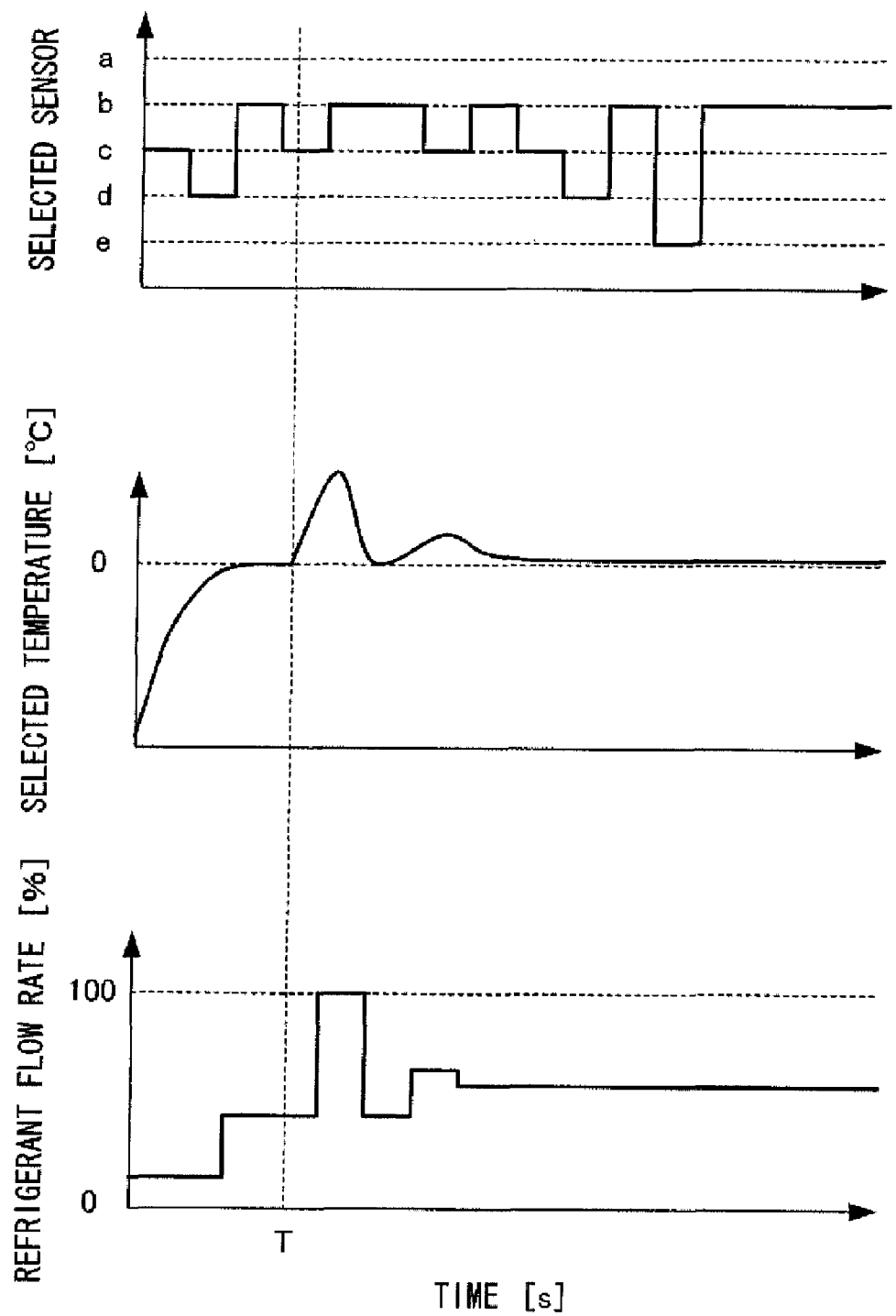
FIG. 8 is a diagram illustrating temperature control at the time of wafer level burn-in according to Embodiment 4 of the invention.

FIG. 8 is a graph illustrating the transition of the areas in which the temperatures selected as a control target of the refrigerant flow rate are measured, a temporal change in the temperature deviation obtained by subtracting the measured temperatures from the predetermined temperatures selected as the control target of the refrigerant flow rate, and a temporal change in the refrigerant flow rate, in the wafer level burn-in according to Embodiment 4. In the example of FIG. 8, the areas are heated from a room temperature and stabilized to 125° C., and then an electric load is applied from a tester 105 to devices formed on the wafer at a time T. Since the temperature in the vicinity of the conforming devices increases as the electric load is applied, the refrigerant flow rate increases. As the control target of the refrigerant, the area with the largest value among the temperature deviations obtained by subtracting the measured temperatures from the predetermined temperatures of the sensors is selected at predetermined time intervals like the areas c, b, c, b, and c. The refrigerant flow rate is changed with respect to the temperature deviation of the area at predetermined time intervals. In this case, since the cooling is performed according to the area with the largest value among the temperature deviations, the area with a temperature lower than the control target temperature of the refrigerant flow rate shown in FIG. 8 exists. For this reason, the area with a temperature lower than the predetermined temperature temporarily exists. However, a decrease in temperature is suppressed by heating each area, and thus the temperature deviation is stabilized to 0° C. in all the areas.

In Embodiment 4, the refrigerant is used as a cooling source, but a wind generated by an air blower such as a fan may be blown to the temperature regulation plate. In this case, the temperature regulation plate may be provided with a fin to improve a cooling performance. In Embodiment 4, the wafer is divided into the five areas to control the temperatures by way of example, but the wafer may be divided into two or more areas to control the temperatures in the same manner.

As described above, the wafer is divided into the plurality of areas, and the temperature sensor, a heater, and a temperature regulator are provided for each area. The cooling is controlled in response to the largest deviation among the temperature deviations obtained by subtracting the predetermined temperatures from the temperatures measured by the sensors. The heating is controlled for each area. Accordingly, it is possible to reduce variation in in-plane temperature of the wafer caused by the heat generated at the time of applying the electric load, without depending on the distribution of conforming products of the devices formed on the wafer or power consumption of the devices. Consequently, consumption and burning of the probes are prevented and thus it is possible to provide a highly reliable wafer level burn-in apparatus and wafer level burn-in method.

The invention claimed is:

1. A wafer level burn-in apparatus for performing screening of defective products by collectively applying an electric load and a temperature load to all devices formed on a semiconductor wafer divided into a plurality of areas, the wafer level burn-in apparatus comprising:
   a plurality of temperature sensors that measure temperatures of such areas, respectively;
   a plurality of temperature deviation calculating devices that calculate a value of a temperature deviation by subtracting a predetermined temperature value from each temperature measured by each temperature sensor in each area, respectively;
   a plurality of heaters that heat such areas, respectively;
   a plurality of temperature regulators that control the heaters in response to the temperatures measured by the temperature sensors so that the temperature of each such area becomes a predetermined temperature;
   a cooling source that cools the entire semiconductor wafer;
   a switching controller that selects the temperatures measured by the temperature sensors to control the cooling source;
   a cooling temperature regulator that controls the cooling source in response to a temperature selected by the switching controller; and
   a tester that inspects such devices,
   wherein the cooling temperature regulator is controlled by selecting the largest value among the values obtained by the temperature deviation calculating devices and performing the cooling operation so that the temperature deviation becomes 0° C., and heating control is performed for each such area, thereby controlling a temperature of the semiconductor wafer to such predetermined temperature to perform wafer level burn-in.

2. The wafer level burn-in apparatus according to claim 1, wherein the cooling source is a refrigerant flowing passage for flowing refrigerant therethrough and the cooling temperature regulator is a temperature regulator for controlling a refrigerant flow rate.

3. The wafer level burn-in apparatus according to claim 1, wherein the cooling source is an air blower and the cooling temperature regulator is a temperature regulator for controlling an air blow rate.

4. The wafer level burn-in apparatus according to claim 1, wherein the switching controller continuously selects the temperature to be used for the cooling control.

5. The wafer level burn-in apparatus according to claim 1, wherein the switching controller selects the temperature to be used for the cooling control at predetermined time intervals.

6. The wafer level burn-in apparatus according to claim 1, wherein the switching controller selects the temperature to be used for the cooling control when the intensity of the electric load is switched.

7. A wafer level burn-in method for screening defective products comprising:
   applying both an electric load and a temperature load to all devices formed on a semiconductor wafer divided into a plurality of areas which comprise a central area and a plurality of peripheral areas to control a temperature of such a semiconductor wafer to a predetermined temperature;
   measuring temperature in each area of the semiconductor wafer using a plurality of temperature sensors;
   calculating a value of a temperature deviation by subtracting the predetermined temperature value from each temperature measured by each temperature sensor in each area, respectively;
   cooling the entire semiconductor wafer by controlling a cooling source using one temperature selected from temperatures measured by the plurality of temperature sensors controlled by selecting the largest value among the values so that the temperature deviation becomes 0° C.; and
   heating such areas by performing heating control of respective such areas in response to the temperatures measured for the respective areas
   so that a predetermined temperature for a central area is lower than a predetermined temperature for a plurality of peripheral areas.

8. The wafer level burn-in method according to claim 7, wherein the cooling source is a refrigerant flowing passage for flowing refrigerant therethrough and the entire semiconductor wafer is cooled by controlling a refrigerant flow rate.

9. The wafer level burn-in method according to claim 7, wherein the cooling source is an air blower and the entire semiconductor wafer is cooled by controlling an air blow rate.

10. The wafer level burn-in method according to claim 7, wherein the selected temperature to be used for the cooling control is the highest temperature of the measured temperatures of the areas.

11. The wafer level burn-in method according to claim 7, wherein the selected temperature to be used for the cooling control is selected in such a manner that when there is one median value among the measured temperatures of the areas, the temperature of the median value is selected; and when there are two median values, the higher temperature among the two temperatures of the median values is selected.

12. The wafer level burn-in method according to claim 7, wherein the selected temperature to be used for the cooling control is a value closest to an average value of the measured temperatures of the areas.

13. The wafer level burn-in method according to claim 7, wherein the selected temperature to be used for the cooling control is the largest value of temperature deviations obtained by subtracting the measured temperatures from the predetermined temperatures of the areas and an output of the cooling source is controlled so that the value of the temperature deviation becomes 0 or near 0.

14. The wafer level burn-in method according to claim 7, wherein the temperature to be used for the cooling control is continuously selected.

15. The wafer level burn-in method according to claim 7, wherein the temperature to be used for the cooling control is selected at predetermined time intervals.

16. The wafer level burn-in method according to claim 7, wherein the temperature to be used for the cooling control is selected when the intensity of the electric load is switched.

17. The wafer level burn-in method according to claim 7, wherein the cooling source is continuously controlled.

18. The wafer level burn-in method according to claim 7, wherein the cooling source is controlled at predetermined time intervals.

* * * * *